United States Patent
Oh

(10) Patent No.: US 10,224,316 B2
(45) Date of Patent: Mar. 5, 2019

(54) TRANSFER APPARATUS AND METHOD OF MANUFACTURING DISPLAY APPARATUS USING THE SAME

(71) Applicant: Samsung Display Co., Ltd., Yongin-Si, Gyeonggi-Do (KR)

(72) Inventor: Hyunjoon Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/396,864

(22) Filed: Jan. 3, 2017

(65) Prior Publication Data
US 2017/0243772 A1 Aug. 24, 2017

(30) Foreign Application Priority Data

Feb. 22, 2016 (KR) .................. 10-2016-0020707

(51) Int. Cl.
| | |
|---|---|
| *H01L 21/00* | (2006.01) |
| *H01L 25/00* | (2006.01) |
| *B32B 37/00* | (2006.01) |
| *H01L 25/16* | (2006.01) |
| *H01L 33/62* | (2010.01) |
| *H01L 21/683* | (2006.01) |
| *H01L 27/12* | (2006.01) |

(52) U.S. Cl.
CPC ............ *H01L 25/50* (2013.01); *B32B 37/025* (2013.01); *H01L 21/6835* (2013.01); *H01L 25/167* (2013.01); *H01L 27/1218* (2013.01); *H01L 27/1248* (2013.01); *H01L 33/62* (2013.01); *B32B 2457/20* (2013.01); *H01L 2221/68354* (2013.01); *H01L 2221/68368* (2013.01); *H01L 2221/68381* (2013.01); *H01L 2933/0033* (2013.01); *H01L 2933/0066* (2013.01)

(58) Field of Classification Search
CPC ............ H01L 21/67132; H01L 25/167; H01L 2221/68363
See application file for complete search history.

(56) References Cited

U.S. PATENT DOCUMENTS

| | | | |
|---|---|---|---|
| 7,888,690 B2 | 2/2011 | Iwafuchi et al. | |
| 7,943,491 B2 | 5/2011 | Nuzzo et al. | |
| 8,796,050 B2 * | 8/2014 | Yoo ..................... | H01L 21/6715 257/E33.059 |

(Continued)

FOREIGN PATENT DOCUMENTS

| | | | | |
|---|---|---|---|---|
| CN | 107123614 A | * | 9/2017 | ........... B23B 37/025 |
| KR | 1020060125620 A | | 12/2006 | |

(Continued)

OTHER PUBLICATIONS

Chun et al., "Transfer of GaN LEDs from Sapphire to Flexible Substrates by Laser Lift-Off and Contact Printing", IEEE Photonics Technology Letters, vol. 24, No. 23 , 2012, pp. 2115-2118.

*Primary Examiner* — Laura M Menz
(74) *Attorney, Agent, or Firm* — Cantor Colburn LLP

(57) ABSTRACT

A transfer apparatus includes: a body portion; and an adhesive portion connected to the body portion, with which a point light source of a display apparatus is attachable to and detachable from the transfer apparatus by contact therewith. The adhesive portion is defined by a plurality of surfaces in different planes from each other.

13 Claims, 19 Drawing Sheets

(56) References Cited

U.S. PATENT DOCUMENTS

| | | | | |
|---|---|---|---|---|
| 9,756,723 | B2* | 9/2017 | Hong | H05K 1/0283 |
| 2004/0235267 | A1* | 11/2004 | Sheats | H01L 21/67092 |
| | | | | 438/455 |
| 2008/0205947 | A1* | 8/2008 | Miyamoto | G03G 15/161 |
| | | | | 399/308 |
| 2010/0317132 | A1* | 12/2010 | Rogers | H01L 25/0753 |
| | | | | 438/27 |
| 2014/0218954 | A1* | 8/2014 | Yoon | H01L 33/62 |
| | | | | 362/546 |
| 2016/0198567 | A1* | 7/2016 | Hong | H05K 1/0283 |
| | | | | 362/418 |
| 2017/0025484 | A1* | 1/2017 | Forrest | H01L 51/56 |
| 2017/0047534 | A1* | 2/2017 | Yoon | H01L 51/0097 |
| 2017/0140959 | A1* | 5/2017 | Huska | H01L 33/62 |
| 2017/0243772 | A1* | 8/2017 | Oh | B32B 37/025 |

FOREIGN PATENT DOCUMENTS

| | | | |
|---|---|---|---|
| KR | 1020110118616 A | | 10/2011 |
| KR | 1020140042320 A | | 4/2014 |
| KR | 20170099028 A | * | 8/2017 ........... B23B 37/025 |

* cited by examiner

TRANSFER APPARATUS AND METHOD OF MANUFACTURING DISPLAY APPARATUS USING THE SAME

This application claims priority to Korean Patent Application No. 10-2016-0020707, filed on Feb. 22, 2016, all the benefits accruing therefrom under 35 U.S.C. § 119, the contents of which in their entirety are herein incorporated by reference.

BACKGROUND

1. Field

One or more embodiments relate to a transfer apparatus, and a transfer method and a display apparatus using the same.

2. Description of the Related Art

Light-emitting diodes ("LEDs") that are point light source devices for converting electrical signals into light such as infrared light or visible light by using characteristics of compound semiconductors, are used in home appliances, remote controllers, electric boards and various automatic devices. LEDs are widely used in various electronic devices ranging from relatively small hand-held electronic devices to relatively large display apparatuses, and applications of LEDs are increasing.

SUMMARY

One or more exemplary embodiments include a transfer apparatus and a method using the same which may allow a plurality of light-emitting diodes ("LEDs") to be transferred to a display apparatus at a same time, and especially to a display substrate of the display apparatus whose surface discontinuously changes.

One or more exemplary embodiments include a display apparatus for which a surface of a display substrate thereof discontinuously changes, manufactured by using a transfer apparatus to transfer plural point light sources to the discontinuous surface of the display substrate.

According to one or more exemplary embodiments, a transfer apparatus includes: a body portion; and an adhesive portion connected to the body portion, with which a point light source of a display apparatus is attachable to and detachable from the transfer apparatus by contact therewith. The adhesive portion is defined by a plurality of surfaces in different planes from each other.

The body portion may include an elastomer.

The adhesive portion may define a first surface of the body.

The body may define a second surface thereof which faces the first surface.

A thickness of the body portion may be non-uniform to define the plurality of the surfaces of the adhesive portion in different planes from each other.

The plurality of surfaces of the adhesive portion in different planes from each other may be defined by a plurality of sub-adhesive portions at different heights with respect to a common surface of the body portion.

The point light source may be provided in plurality, each of which is attachable to and detachable from the transfer apparatus by contact with the adhesive portion, and among the plurality of point light sources, at least one point light source may be attachable to and detachable from the transfer apparatus with each of the plurality of sub-adhesive portions at the different heights with respect to the common surface of the body portion.

The different heights of the plurality of sub-adhesive portions may discontinuously change with respect to the common surface of the body portion.

The different heights of the plurality of sub-adhesive portions may be adjustable with respect to the common surface of the body portion.

The different heights of the plurality of sub-adhesive portions may define an original state of the transfer apparatus, and in a deformed state of the transfer apparatus by an external pressure applied to the original state of the transfer apparatus, the plurality of sub-adhesive portions may be disposed at a same height as each other with respect to the common surface of the body portion.

The transfer apparatus may further include a plurality of sub-connectors respectively connecting the plurality of sub-adhesive portions to the body portion.

A length of each of the plurality of sub-connectors may be adjustable.

A portion of the adhesive portion that contacts the point light source may have a convex shape before contact with the point light source.

According to one or more exemplary embodiments, a method of transferring a point light source includes: positioning an adhesive portion of a transfer apparatus on a carrier substrate with a point light source provided in plurality on a single planar surface thereof, the adhesive portion defined as a non-planar surface; applying pressure to the transfer apparatus to adhere the plurality of point light sources on the single planar surface of the carrier substrate to the non-planar surface of the adhesive portion of the transfer apparatus; separating the plurality of point light sources adhered to the adhesive portion of the transfer apparatus from the single planar surface of the carrier substrate; positioning the transfer apparatus with the plurality of point light sources adhered to the adhesive portion of the transfer apparatus on a display substrate of a display apparatus; and separating the plurality of point light sources adhered to the adhesive portion of the transfer apparatus from the transfer apparatus to transfer the plurality of point light sources to a surface of the display substrate.

When the pressure is applied to the transfer apparatus, a shape of the non-planar surface of the adhesive portion may be changed to a single planar surface.

An original shape formed by the non-planar surface of the adhesive portion may be complementary to a shape of the surface of the display substrate to which the plurality of point light sources are transferred.

A height of the surface display substrate to which the plurality of point light sources are transferred may discontinuously change.

The transfer apparatus may include an elastomer. According to one or more exemplary embodiments, a display apparatus includes: a first light-emitting diode (LED) and a second LED having different heights; and a display substrate having first and second pixel regions, and including, in the first pixel region, a first thin-film transistor (TFT) and a first electrode configured to connect the first LED and the first TFT and, in the second pixel region, a second TFT and a second electrode configured to connect the second LED and the second TFT, wherein heights of the pixel region and the second pixel region are different from each other to respectively correspond to the first LED and the second LED.

A thickness of the display substrate may discontinuously change.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
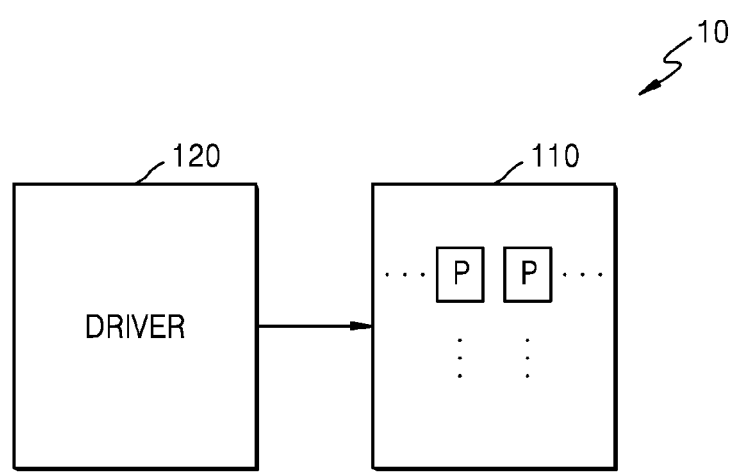
FIG. 1 is a top plan view of an exemplary embodiment of a display apparatus according to the invention.

The invention may include various exemplary embodiments and modifications, and exemplary embodiments thereof will be illustrated in the drawings and will be described herein in detail. The advantages and features of the invention and methods of achieving the advantages and features will be described more fully with reference to the accompanying drawings, in which exemplary embodiments of the invention are shown. The invention may, however, be embodied in many different forms and should not be construed as being limited to the exemplary embodiments set forth herein.

Reference will now be made in detail to exemplary embodiments, examples of which are illustrated in the accompanying drawings. In the drawings, the same elements are denoted by the same reference numerals, and a repeated explanation thereof will not be given.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on," another layer, region, or element, it can be directly or indirectly formed on the other layer, region, or element. That is, for example, intervening layers, regions, or elements may be present. In contrast, when a layer, region, or element is referred to as being "directly on" another layer, region, or element, there are no intervening elements present.

Sizes of elements may be exaggerated for convenience of explanation. In other words, since sizes and thicknesses of elements in the drawings are arbitrarily illustrated for convenience of explanation, the following embodiments are not limited thereto. The term "on" or "under" refers to a top or bottom of a target in the drawings, and does not necessarily mean the top or bottom of the target in a direction of gravity.

As used herein, the term "and/or" includes any and all combinations of one or more of the associated listed items. Expressions such as "at least one of," when preceding a list of elements, modify the entire list of elements and do not modify the individual elements of the list.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a top plan view of an exemplary embodiment of a display apparatus 10 according to the invention.

Referring to FIG. 1, the display apparatus 10 may include a display portion 110 and a driver 120. The display apparatus 10 may include a substrate on which the display portion 110 is disposed. The display portion 110 may include a pixel P provided in plurality and arranged in a matrix on the substrate. The driver 120 may include a scan driver that applies a scan signal to a scan line of the display portion which is connected to the pixels P of the display portion 110, and a data driver that applies a data signal to a data line of the display portion 110. The display portion 110 may define a display portion of the substrate. The driver 120 may be disposed on a non-display portion of the substrate which is disposed around the display portion 110 including the pixels P. The driver 120 may be formed as an integrated circuit chip and may be directly mounted on the substrate on which the display portion 110 is disposed, may be mounted on a flexible printed circuit film, may be attached as a tape carrier package ("TCP") to the substrate, or may be disposed directly on the substrate.

Figure 2:
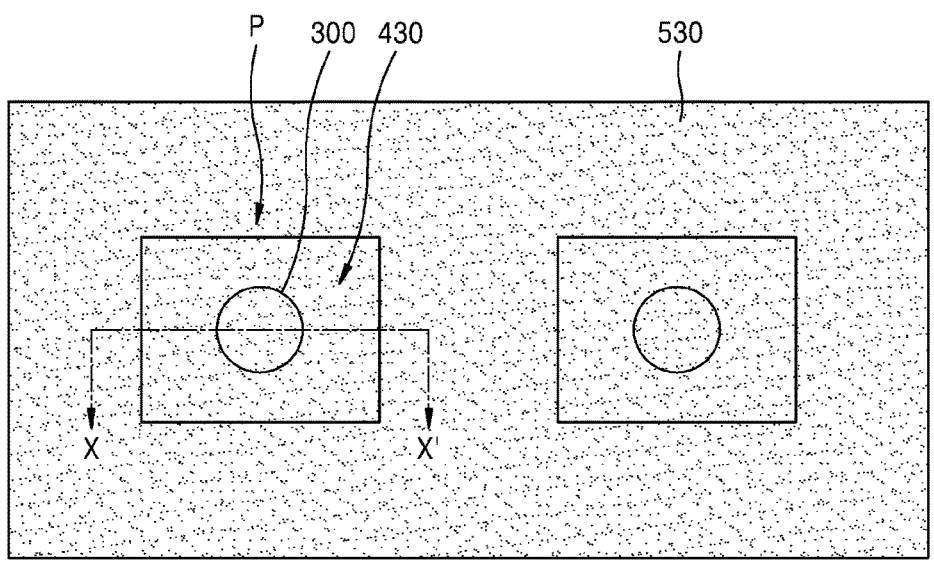
FIG. 2 is a top plan view of an exemplary embodiment of pixels of the display apparatus of FIG. 1.
Figure 3:
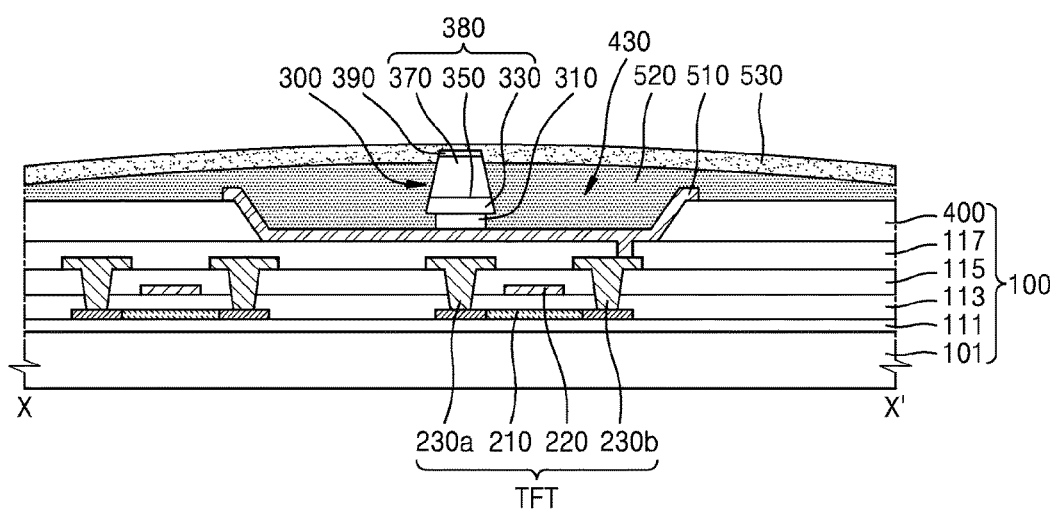
FIG. 3 is a cross-sectional view taken along line X-X' of FIG. 2.

FIG. 2 is a top plan view of an exemplary embodiment of pixels P of the display apparatus 10 of FIG. 1. FIG. 3 is a cross-sectional view taken along line X-X' of FIG. 2.

Referring to FIGS. 2 and 3, each pixel P may include a point light source such as a light-emitting diode ("LED") 300 and a pixel circuit which is connected to the LED 300. The pixel circuit may include at least one transistor ("TFT") and at least one capacitor. The pixel circuit may control operation of the LED 300 to drive the pixel P. The pixel circuit is connected to the scan line and the data line of the display portion 110. The scan line and the data line may cross each other in the display portion 110. In FIG. 3, one of two TFTs in a same pixel P is connected to one LED 300. In an exemplary embodiment, the display apparatus 10 may include a display substrate 100 and the LED 300 is disposed on the display substrate 100.

The display substrate 100 may include a (base) substrate 101, a TFT disposed on the substrate 101, and a planarization layer 117 disposed on the TFT, and a first electrode 510 connected to the TFT through a via hole defined in the planarization layer 117. However, the exemplary embodiment is not limited thereto. The display substrate 100 may be a substrate excluding the LED 300 and the TFT. That is, the display substrate 100 may be in a state for which an element including the LED 300 is not disposed thereon but will be transferred thereto.

The substrate 101 may include any of various materials. In an exemplary embodiment, for example, the substrate 101 may include or be formed of a transparent glass material such as having SiO$_2$ as a main component. However, the substrate 101 is not limited thereto, and may include or be formed of a transparent plastic material and may be flexible. The transparent plastic material may be an insulating organic material selected from polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide, polycarbonate ("PC)", cellulose triacetate ("TAC") and cellulose acetate propionate ("CAP").

When the display apparatus 10 is a bottom emission display apparatus in which an image is displayed toward or at the substrate 101, the substrate 101 includes a transparent material. However, when the display apparatus 10 is a top emission display apparatus in which an image is displayed in a direction away from the substrate 101, the substrate 101 may not include a transparent material. In this case, the substrate 101 may include or be formed of a metal material.

When the substrate 101 includes or is formed of a metal material, the substrate 101 may include at least one selected from, but not limited to, iron, chromium, manganese, nickel, titanium, molybdenum, stainless steel ("SUS"), an Invar alloy, an Inconel alloy and a Kovar alloy.

A buffer layer 111 may be disposed or formed on the substrate 101. The buffer layer 111 may planarize a top surface of the substrate 101 and may reduce or effectively prevent impurities or moisture from penetrating into the substrate 101. In an exemplary embodiment, for example, the buffer layer 111 may include an inorganic material such as silicon oxide, silicon nitride, silicon oxynitride, aluminum oxide, aluminum nitride, titanium oxide, or titanium nitride or an organic material such as polyimide, polyester, or acryl. The buffer layer 11 may be formed by stacking a plurality of layers of the above-described materials.

The TFT and the LED 300 may be provided on the buffer layer 111. The TFT and the LED 300 may be provided in plurality on the buffer layer 111.

The TFT includes an active layer 210, a gate electrode 220, a source electrode 230a and a drain electrode 230b. The active layer 210 may include a semiconductor material, and has a source region, a drain region, and a channel region which is formed between the source region and the drain region. The gate electrode 220 is disposed or formed over the active layer 210 to correspond to the channel region. The source electrode 230a and the drain electrode 230b are respectively physically and/or electrically connected to the source region and the drain region of the active layer 210.

A first insulating layer 113 including or formed of an inorganic insulating material is disposed as a gate insulating film between the active layer 210 and the gate electrode 220. A second insulating layer 115 is disposed as an interlayer insulating film between the gate electrode 220 and the source electrode 230a and between the gate electrode 220 and the drain electrode 230b. A third insulating layer 117 is disposed as a planarization film on the source electrode 230a and the drain electrode 230b. Each of the second insulating layer 115 and the third insulating layer 117 may include or be formed of an organic insulating material or an inorganic insulating material, and may be formed by alternately disposing an organic insulating material layer and an inorganic insulating material layer.

Although the TFT is illustrated as a top gate TFT in which the gate electrode 220 is disposed over the active layer 210 in FIG. 3, the exemplary embodiment is not limited thereto and the gate electrode 220 may be disposed under the active layer 210 in a bottom gate TFT.

A bank 400 for defining a pixel region of the pixel P may be disposed on the third insulating layer 117. The bank 400 includes or defines a recessed portion 430 in which the LED 300 is received. A height of the bank 400 may be determined by a height of the LED 300 and a viewing angle of the display apparatus 10. The heights may be taken from a common reference such as the substrate 101, and may represent a maximum distance from the common reference. In a direction parallel to the substrate 101, a size (width) of the recessed portion 430 may be determined by a resolution or a pixel density of the display apparatus 10. In an exemplary embodiment, a height of the LED 300 may be greater than a height of the bank 400. Although the recessed portion 430 has a quadrangular shape in the top plan view of FIG. 2, the exemplary embodiment is not limited thereto, and the recessed portion 430 may have any of various other shapes in the top plan view such as a polygonal shape, a rectangular shape, a circular shape, a conical shape, an elliptical shape or a triangular shape.

The first electrode 510 is disposed along a side surface and a bottom surface of the recessed portion 463. The first electrode 510 extended along the side and bottom surfaces of the recessed portion 463 may further extent to be disposed on a top surface of the bank 400 which is disposed adjacent to and around the recessed portion 430. The first electrode 510 is electrically connected to the source electrode 230a or the drain electrode 230b of the TFT through a via hole defined in the third insulating layer 117. In FIG. 3, the first electrode 510 is electrically connected to the drain electrode 230b.

The bank 400 may reduce or prevent mixture of light generated by adjacent LEDs 300 by acting as an internal light blocker with a relatively low light transmittance to block light discharged at a side surface of each LED 300. Also, the bank 400 may increase an ambient contrast ratio of the display apparatus 10 by absorbing or blocking external light. The bank 400 may include a light-absorbing material that absorbs light, a light-reflecting material and/or a light-scattering material.

The bank 400 may include an insulating material that is semi-transparent or opaque to visible light (e.g., light with wavelengths ranging from about 380 nanometers (nm) to about 750 nm). The bank 400 may include or be formed of, but not limited to, a thermoplastic resin such as PC, PET, polyethersulfone, polyvinyl butyral, polyphenylene ether, polyamide, polyetherimide, norbornene-based resin, methacrylic resin, cyclic polyolefin-based resin, a thermosetting resin such as epoxy resin, phenolic resin, urethane resin, acrylic resin, vinyl ester resin, imide-based resin, urethane-based resin, urea resin, or melamine resin, or an organic insulating material such as polystyrene, polyacrylonitrile or polycarbonate. The bank 400 may include or be formed of, but not limited to, an inorganic insulating material such as inorganic oxide or inorganic nitride (e.g., SiOx, SiNx, SiNxOy, AlOx, TiOx, TaOx, or ZnOx).

In an exemplary embodiment, the bank 400 may be formed of an opaque material such as a black matrix material. Examples of an insulating black matrix material may include an organic resin, glass paste, a resin or paste including a black pigment, metallic particles (e.g., nickel, aluminum, molybdenum, or an alloy thereof), metal oxide particles (e.g., chromium oxide), and metal nitride particles (e.g., chromium nitride). In another exemplary embodiment, the bank 400 may be a distributed Bragg reflector having a relatively high reflectance or a mirror reflector formed of a metal material.

The LED 300 is disposed in the recessed portion 430 of the bank 400. The LED 300 may be a micro-size LED. The term "'micro size" may refer to a size ranging from about 1 micrometer (μm) to about 100 micrometers (μm). However, the exemplary embodiment is not limited thereto, and may be applied to an LED with a greater or less size. One LED 300 or a plurality of the LEDs 300 may be received in a same recessed portion 430 defined on of the substrate 101. In an exemplary embodiment of manufacturing the display apparatus 10, the one or more LED may be disposed in the same recessed portion 430 by being picked up or separated from a wafer such as by a feed mechanism and being transferred to the substrate 101 on which the recessed portion 430 is previously defined. In an exemplary embodiment of manufacturing the display apparatus 10, the LED 300 may be received in the recessed portion 430 of the display substrate 101 after the bank 400 and the first electrode 510 are formed on the substrate 101. The LED 300 may generate and emit light with a predetermined wavelength included in a wavelength range from ultraviolet ("UV") light to visible light. In an exemplary embodiment, for example, the LED 300 may be a red, green, blue or white LED or a UV LED.

The LED 300 may include a p-n diode 380, a first contact electrode 310 and a second contact electrode 390. The first contact electrode 310 and/or the second contact electrode 390 may include at least one material layer, and may include or be formed of any of various conductive materials including a metal material, a conductive oxide and conductive polymers. Each of the first contact electrode 310 and the second contact electrode 390 may selectively include a reflective layer, for example, a silver layer. The first contact electrode 310 is physically and/or electrically connected to the first electrode 510 and the second contact electrode 390 is physically and/or electrically connected to a second electrode 530. The p-n diode 380 may include a first semiconductor layer 330 that is a lower p-doping layer, at least one intermediate layer 350 that is a quantum well layer, and a second semiconductor layer 370 that is an upper n-doping layer. In another exemplary embodiment, the second semiconductor layer 370 may be a p-doping layer and the first semiconductor layer 330 may be an n-doping layer. In cross-section, the p-n diode 380 may have a straight side wall, or a side wall that is tapered upward or downward.

The first electrode 510 may be a reflective electrode, and may include at least one material layer. In an exemplary embodiment, for example, the first electrode 510 may include a metal material such as aluminum, molybdenum, titanium, tungsten, silver, gold or an alloy thereof. The first electrode 510 may include a reflective layer and a transparent conductive layer including a conductive material such as a transparent conductive oxide ("TCO") (e.g., indium tin oxide ("ITO"), indium zinc oxide ("IZO"), ZnO, or In2O3), a carbon nanotube film, or a transparent conductive polymer. In an exemplary embodiment, the first electrode 510 may have a three-layer structure including upper and lower transparent conductive layers and a reflective layer which is disposed between the upper and lower transparent conductive layers.

The second electrode 530 may be a transparent or semi-transparent electrode. In an exemplary embodiment, for example, the second electrode 530 may include or be formed of a conductive material such as a TCO (e.g., TIO, IZO, ZnO, or $In_2O_3$), a carbon nanotube film, or a transparent conductive polymer. The second electrode 530 may include or be formed on the entire substrate 101 to act as a common electrode for the pixels P.

A passivation layer 520 is disposed in the recessed portion 300 and surrounds the LED 300 in the recessed portion 300. The passivation layer 520 in the recessed portion 300 extends to cover the bank 400 and the LED 300. The passivation layer 520 is formed at a height so as to not cover the top (distal end) of the LED 300, for example, the second contact electrode 390, and thus exposes the second contact electrode 390. The passivation layer 520 may include an organic insulating material. In an exemplary embodiment, for example, the passivation layer 520 may include or be formed of, but not limited to, acryl, poly(methyl methacrylate) ("PMMA"), benzocyclobutene ("BCB"), polyimide, acrylate, epoxy, or polyester. The second electrode 530 that is electrically connected to the exposed second contact electrode 390 of the LED 300 is disposed on the passivation layer 520.

Figure 4A:
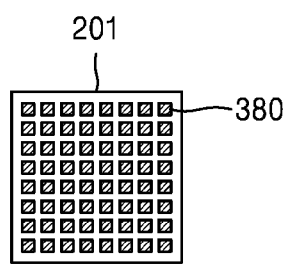
FIGS. 4A and 4B are top plan views and FIG. 5 is a cross-sectional view for explaining an exemplary embodiment of a method of manufacturing the display apparatus of FIG. 1.
Figure 4B:
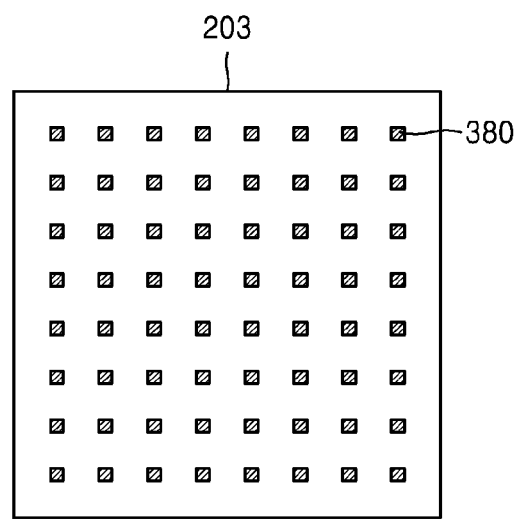
Figure 5:
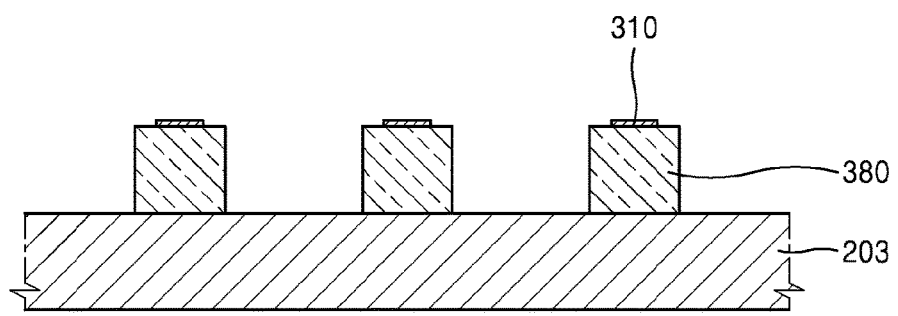

FIGS. 4A and 4B are top plan view and FIG. 5 is a cross-sectional view for explaining an exemplary embodiment a method of manufacturing the display apparatus 10 of FIG. 1.

As shown in FIG. 4A, a p-n diode 380 may be disposed or formed in plurality on a base substrate 201. The base substrate 201 may be a conductive substrate or an insulating substrate, and may include or be formed of at least one material selected from among, for example, sapphire ($Al_2O_3$), SiC, silicon (Si), GaAs, GaN, ZnO, GaP, InP, germanium (Ge), and $Ga_2O_3$.

Each of the plurality of p-n diodes 380 may include the first semiconductor layer 330 (see FIG. 3), the second semiconductor layer 370 (see FIG. 3), and the intermediate layer 350 (see FIG. 3) which is disposed between the first semiconductor layer 330 and the second semiconductor layer 370. Each of the first semiconductor layer 330, the intermediate layer 350 and the second semiconductor layer 370 may be formed on the base substrate 201 by using metal organic chemical vapor deposition ("MOCVD"), chemical vapor deposition ("CVD"), plasma-enhanced chemical vapor deposition ("PECVD"), molecular beam epitaxy ("MBE") or hydride vapor phase epitaxy ("HVPE").

Referring to FIG. 4B, the plurality of p-n diodes 380 formed on the base substrate 201 are separated from the base substrate 201 and are arranged on a carrier substrate 203 to be spaced apart from one another at a distance greater than that on the base substrate 201.

Next, as shown in FIG. 5, a first contact electrode 310 may be formed on each of the plurality of p-n diodes 380. The first contact electrode 310 is formed on an exposed end of the plurality of p-n diodes 380 with the plurality of p-n diodes 380 on the carrier substrate 203. The first contact electrode 310 may include at least one material layer, and may be formed of any of various conductive materials including a metal material, a conductive oxide, and conductive polymers. The first contact electrodes 310 are exposed at distal ends of the plurality of p-n diodes 380 which are opposite to the carrier substrate 203.

Although each LED 300 is formed by disposing the first contact electrode 310 on the p-n diode 380 which is in a state excluding the second contact electrode 390 thereof in FIG. 5, the exemplary embodiment is not limited thereto. In an exemplary embodiment, the second contact electrode 390, the p-n diode 380 and the first contact electrode 310 may be sequentially formed on the carrier substrate 203 such that the first contact electrodes 310 are exposed at distal ends of the plurality of p-n diodes 380 which are opposite to the carrier substrate 203.

In an exemplary embodiment of manufacturing the display apparatus 10, one LED 300 or a plurality of the LEDs 300 on the carrier substrate 203 may be picked up or separated from the carrier substrate 203 and may be transferred to the display substrate 100 by a transfer apparatus.

The display substrate 100 in a state for which LEDs 300 are not disposed thereon, may have any of various shapes according to use of the display substrate 100 in a display apparatus 10. The display substrate 100 may have an overall flat panel shape so that the plurality of LEDs 300 transferred to the display substrate 100 are disposed in the same plane or the display substrate 100 may have a three-dimensional (e.g., non-flat panel) shape which defines surfaces thereof multiple planes. In an exemplary embodiment, for example, a surface height of the display substrate 100 may discontinuously change. In the state for which LEDs 300 are not disposed thereon, an upper surface of the display substrate 100 may define the surface height at a maximum distance from a lower surface of the display substrate 100.

Figure 6:
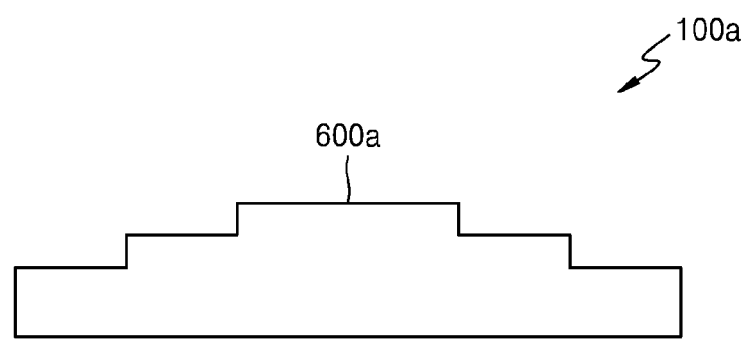
FIGS. 6 through 8 are cross-sectional views of respective exemplary embodiments of display substrates of a display apparatus according to the invention.
Figure 7:
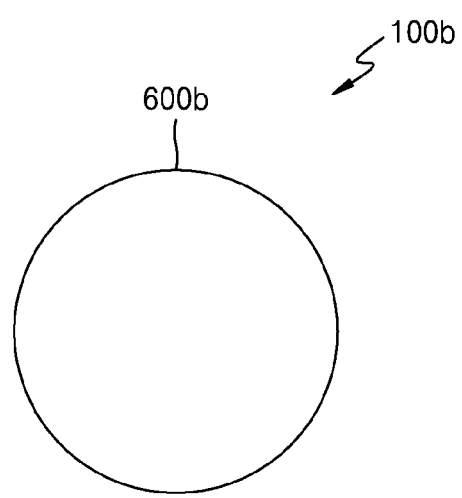
Figure 8:
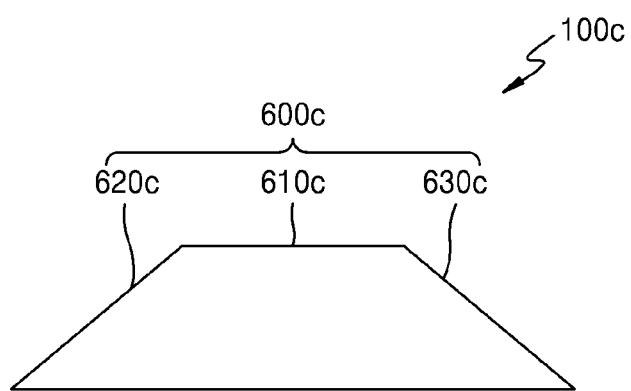

FIGS. 6 through 8 are cross-sectional views of respective exemplary embodiments of display substrates of a display apparatus according to the invention. The display substrates 100a, 100b and 100c illustrated in FIGS. 6 through 8 are shown with an overall shape due to individual layers of the display substrate disposed on a base substrate (refer to FIG. 3), and the individual layers are omitted for convenience of illustration.

As shown in the cross-sectional view of FIG. 6, a display substrate 100a may have a stepped upper surface 600a. In an exemplary embodiment, for example, the upper surface 600a of the display substrate 100a may include or be defined by a plurality of sub-surfaces at different heights from a same lower surface of the display substrate 100a. Heights of the sub-surfaces may be uniform for an entirety thereof respectively, and heights of the sub-surfaces may discontinuously change among the sub-surfaces. At least one LED may be disposed on each of the sub-surfaces. The sub-surfaces may be disposed in different planes from each other.

Alternatively, as shown in the cross-sectional view of FIG. 7, a position or plane of an outer surface 600b of a display substrate 100b may continuously change to include or define a curved shape. In an exemplary embodiment, for example, the display substrate 100b may have a spherical or cylindrical shape in the cross-section. A plurality of LEDs may be disposed on the surface 600b having the curved shape.

Alternatively, as shown in FIG. 8, a display substrate 100c may include or define second and third surfaces 620c and 630c that are inclined surfaces with respect to a rear surface of the display substrate 100c, whose heights continuously change from the rear surface to a front surface of the display substrate 100c. In an exemplary embodiment, for example, the display substrate 100c may include the rear surface and the front surface 600c which faces the rear surface. The front surface 600c may include or define a first surface 610c parallel to the rear surface, and the second and third surfaces 620c and 630c inclined from the rear surface to respectively meet opposing ends of the first surface 610c. A thickness of the display substrate 100c may increase in a direction from distal ends of the second and third surfaces 620c and 630c toward the first surface 610c.

A display apparatus is not limited to the display substrates 100a, 100b and 100c of FIGS. 6 through 8, and may have any of various other curved surfaces in cross-section on which an LED is disposed. That is, the display substrate may be formed so that heights of portions on which LEDs are to be disposed are different from one another, e.g., in different planes from each other.

As described above, a display apparatus may be manufactured by transferring an LED to a display substrate having a curved surface or surfaces in different planes from each other. When the LED is transferred to the respective surface, the LED may be transferred one by one in a conventional method of manufacturing a display apparatus. However, in the conventional method, process efficiency may be undesirably reduced.

Figure 9:
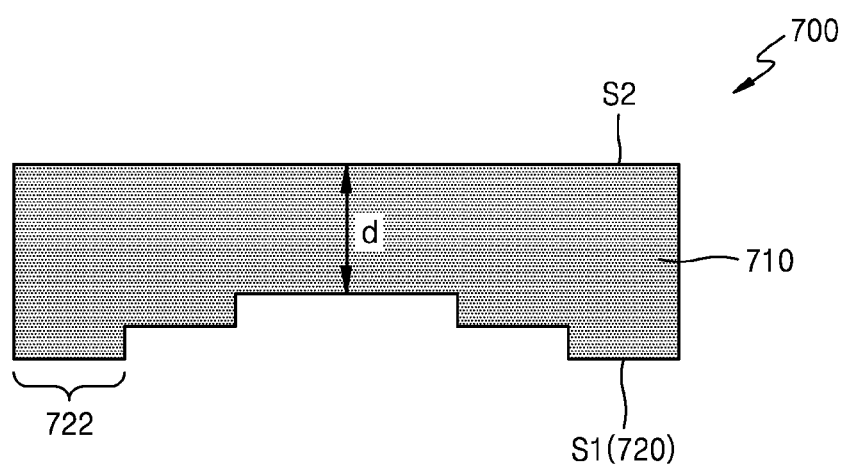
FIG. 9 is a cross-sectional view of an exemplary embodiment of a transfer apparatus according to the invention.

A transfer apparatus according to one or more exemplary embodiment of the invention may have a complementary shape to that of a display substrate to which the LED is transferred by the transfer apparatus. Where the transfer apparatus has the complementary shape to that of the display substrate, a plurality of LEDs may be transferred at a same time to a curved or multi-plane surface of the display substrate, especially from a single plan surface carrier substrate. FIG. 9 is a cross-sectional view of an exemplary embodiment of a transfer apparatus 700 according to the invention. As shown in FIG. 9, the transfer apparatus 700 may include a body portion 710 and an adhesive portion 720 which is on or connected to the body portion 710, allowing a plurality of LEDs to be attached/detached thereto/therefrom. The transfer apparatus 700 has or defines a plurality of sub-surfaces. Although not shown in FIG. 9, the transfer apparatus 700 may further include a moving member configured to vertically or horizontally move the body portion 710.

The body portion 710 may include or be formed of an elastomer for which a thickness thereof may be changed due to a pressure thereto. In an exemplary embodiment, for example, the body portion 710 may include silicon, polysiloxanes, polyurethanes, polysilicon-polyurethane, rubber, ethylene-vinyl acetate copolymer, phenolic nitrile rubber, styrene butadiene rubber, polyether-block-amides, polyolefins, various gels or other similar materials.

The body portion 710 may include or define a first surface S1 and a second surface S2 which faces the first surface S1. The first surface S1 may be the adhesive portion 720. The body portion 710 may have a non-uniform thickness in a cross-section thereof. A thickness of the body portion 710 may continuously or discontinuously change. Although an initial thickness of the body portion 710 is non-uniform in FIG. 9, the initial thickness of the body portion 710 may be deformed to become uniform when a pressure is applied to the body portion 710.

At least one LED may be attached/detached to/from the adhesive portion 720. The LED may be attached/detached to/from the adhesive portion 720 due to a surface force such as a van der Waals force. The adhesive portion 720 may include a plurality of sub-adhesive portions 722 at different heights from the second surface S2 of the body portion 710 to be initially disposed in different planes from each other. Each of the sub-adhesive portions 722 may be parallel to the second surface S2 of the body portion 710 and at least one LED from among the plurality of LEDs may be attached/detached to/from each of the sub-adhesive portions 722.

FIGS. 10A through 10E are cross-sectional views for explaining an exemplary embodiment of a method of transferring an LED to a display substrate of a display substrate by using the transfer apparatus 700 of FIG. 9.

Figure 10A:
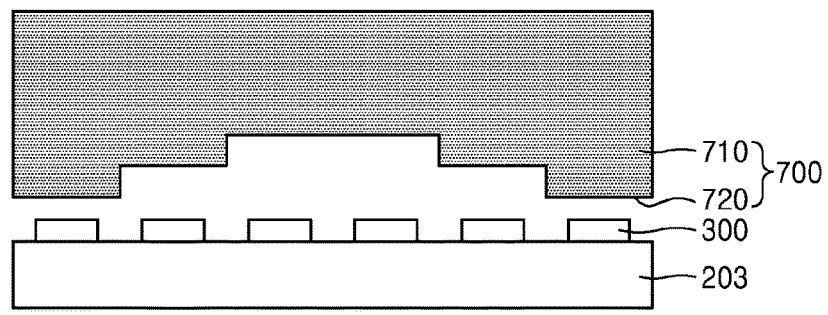
FIGS. 10A through 10E are cross-sectional views for explaining an exemplary embodiment of a method of transferring a light-emitting diode ("LED") to a display substrate of a display apparatus by using the transfer apparatus of FIG. 9.

As shown in FIG. 10A, the LED 300 may be disposed in plurality on the carrier substrate 203 (refer to FIGS. 4A, 4B and 5), such as on a single plane surface of the carrier substrate 203. The transfer apparatus 700 is located above the carrier substrate 203 so that the adhesive portion 720 of the transfer apparatus 700 faces distal ends of the plurality of LEDs 300 on the carrier substrate 203. The first contact electrodes 310 of the plurality of LEDs 300 may be exposed at the distal ends of the plurality of LEDs 300 (refer to FIG. 5). For convenience of illustration, the first contact electrodes 310 of the plurality of LEDs 300 are omitted in FIGS. 10A through 10E.

A pressure may be applied to the body portion 710 of the transfer apparatus 700 so that the adhesive portion 720 of the transfer apparatus 700 contacts the LEDs 300 such as at the distal ends thereof. The pressure may be applied in a direction from the transfer apparatus 700 to the carrier substrate 203. Alternatively, the pressure may be applied in a direction from the carrier substrate 203 to the transfer apparatus 700.

Figure 10B:
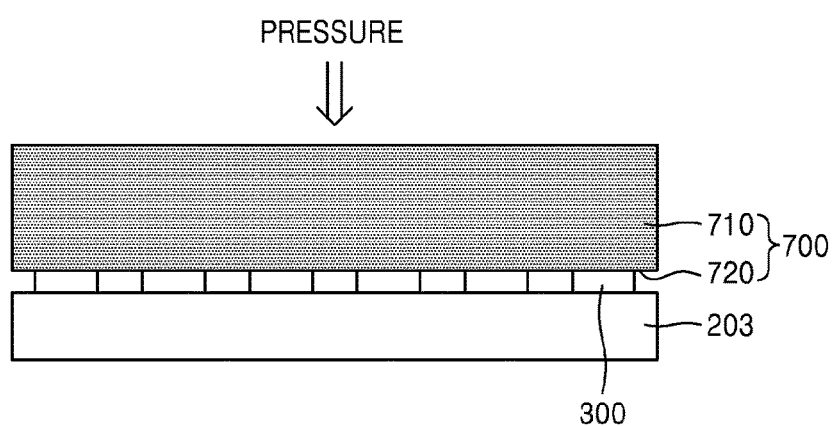

Once a pressure is applied to the body portion 710 of the transfer apparatus 700, the body portion 710 of the transfer apparatus 700 may be deformed from an original shape thereof. In an exemplary embodiment, for example, a thickness of the body portion 710 may be contracted under the pressure and a thickness of the body portion 710 may become uniform across an entirety thereof as shown in FIG. 10B. The non-planar sub-surfaces of the adhesive portion 720 in the original shape thereof may be effectively moved from an initial position thereof to be disposed in a same plane in a contracted state of the body portion 710 under operation of the pressure applied to the body portion 710. Once the plurality of LEDs 300 on the carrier substrate 203 contact the same-plane adhesive portion 720, the plurality of LEDs 300 may be adhered to the same-plane adhesive portion 720 due to a surface force such as a van der Waals force.

Figure 10C:
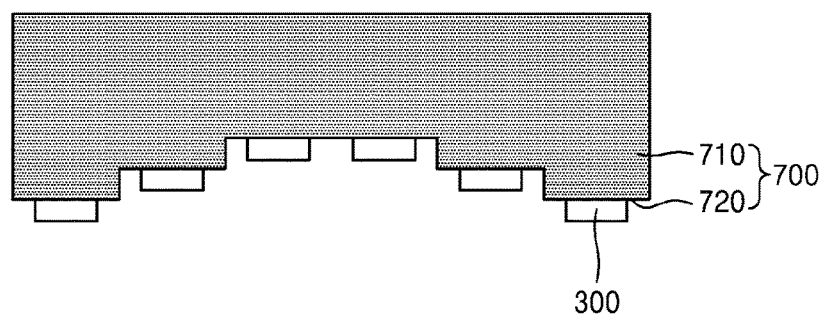

When the pressure applied to the body portion 710 is removed, the body portion 710 may return to the original shape thereof. FIG. 10C is a cross-sectional view of the transfer apparatus 700 in the original shape thereof and to which the LEDs 300 are adhered to the various non-planar sub-surfaces defined by the body portion 710. The LEDs 300 may be removed from the carrier substrate 203 under operation of the body portion 710 returning to the original shape thereof and/or a force applied to distance the carrier substrate 203 and the transfer apparatus 700 from each other.

Figure 10D:
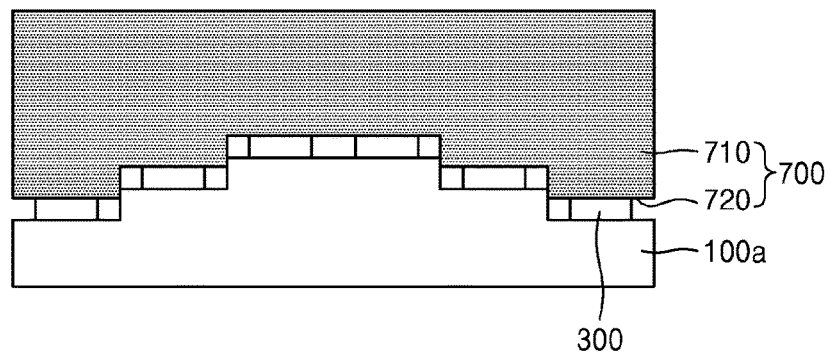
Figure 10E:
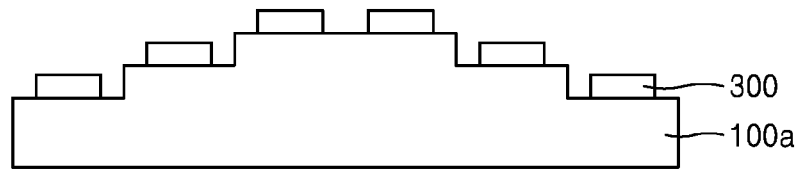

As shown in FIG. 10D, the transfer apparatus 700 in the original shape thereof and with the LEDs 300 attached thereto, may be disposed on the display substrate 100a (refer to FIG. 6). A surface of the display substrate 100a may have a complementary shape to that of the adhesive portion 720 of the transfer apparatus 700 in the original shape thereof. An adhesive material may be disposed on the surface of the display substrate 100a. When a slight pressure is applied to the body portion 710, the LEDs 300 may be adhered to the display substrate 100a and may be separated from the adhesive portion 720 of the transfer apparatus 700. The display substrate 100a may be adhered to the LEDs 300 at the bottom surfaces thereof opposite to the distal ends thereof. Once the transfer apparatus 700 not having the LEDs 300 thereon is removed, the LEDs 300 may be transferred to the surface of the display substrate 100a including the non-planar sub-surfaces thereof, as shown in FIG. 10E. Referring to FIG. 3, although not shown in FIG. 10E, the first contact electrodes 310 of the plurality of LEDs 300 may be exposed at the distal ends of the plurality of LEDs 300 when the LEDs 300 are finally transferred to the surface of the display substrate 100a.

Therefore, the plurality of LEDs are transferred to a display apparatus at a same time, and especially to the display substrate 100a whose surface discontinuously changes.

Figure 11:
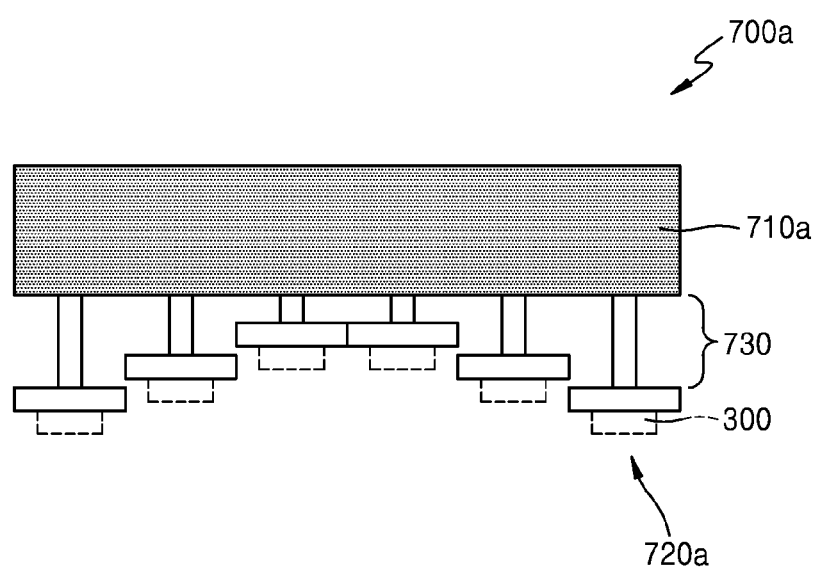
FIG. 11 is a cross-sectional view of another exemplary embodiment of a transfer apparatus according to the invention.

FIG. 11 is a cross-sectional view of another exemplary embodiment of a transfer apparatus 700a according to the invention.

As shown in FIG. 11, the transfer apparatus 700a may include a body portion 710a that is movable, an adhesive portion 720a to/from which the LED 300 may be attached/detached, and a connector 730 that connects the body portion 710a and the adhesive portion 720a to each other. The body portion 710a may include or be formed of an elastomer. However, the invention is not limited thereto, and the body portion 710a may not include or be formed of an elastomer.

The adhesive portion 720a may include or be formed of an elastomer, and may have a surface to which the LEDs 300 may be adhered. The adhesive portion 720a may include or be defined by a plurality of sub-adhesive portions whose heights may be different from one another with respect to a rear surface of the body portion 710a. The connector 730 may include of be defined by a plurality of sub-connectors that respectively connect the plurality of sub-adhesive portions to the same body portion 710a. A length of each of the sub-connectors from the rear surface of the body portion 710a may be adjustable. In an exemplary embodiment, for example, each of the sub-connectors may include or be formed of an elastomer. However, the invention is not limited thereto. A length of each of the sub-connectors with respect to the rear surface of the body portion 710a may be adjusted by using a physical structure which moves the sub-connectors with respect to the rear surface of the body portion 710a. Again, the adhesive portion 720a is movable according to a shape of the display substrate to which the LEDs 300 are transferred.

Since the body portion 710a and the adhesive portion 720a are connected to each other by the connector 730, a height of the adhesive portion 720a with respect to the rear surface of the body portion 710a may be more precisely adjusted. Hence, damage to the LEDs 300 or a display substrate due to a pressure may be reduced.

Figure 12:
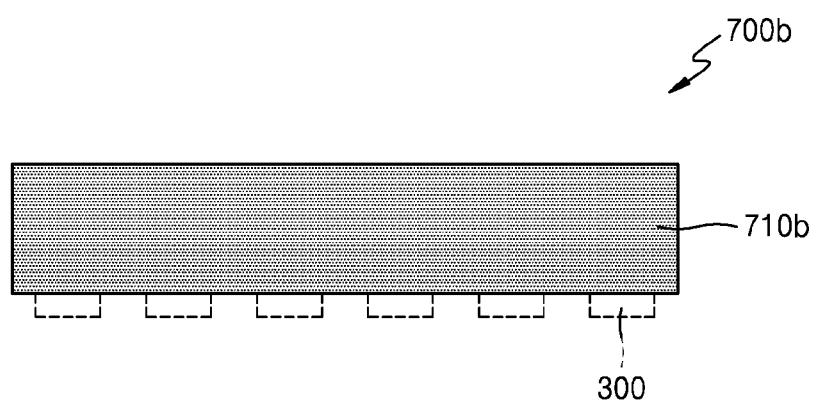
FIG. 12 is a cross-sectional view of still another exemplary embodiment of a transfer apparatus according to the invention.

FIG. 12 is a cross-sectional view of still another exemplary embodiment of a transfer apparatus 700b according to the invention. As shown in FIG. 12, the transfer apparatus 700b may include a body portion 710b whose thickness is uniform as an original shape thereof. The uniform thickness defines a single-plane surface to which LEDs 300 may be attached from a carrier substrate. The plurality of LEDs 300 may be adhered to one surface of the body portion 710b, that is, the surface effectively in one plane. The body portion 710b may include or be formed of an elastomer and thus may be deformed. In an exemplary embodiment, for example, the body portion 710b may be folded or bent into a desired shape from the uniform thickness original flat-shape. That is, when the body portion 710b is folded, positions along the one surface to which the LEDs 300 may be temporarily attached are moved to correspond to positions of the display substrate at which the LEDs will be disposed in a display apparatus.

Figure 13A:
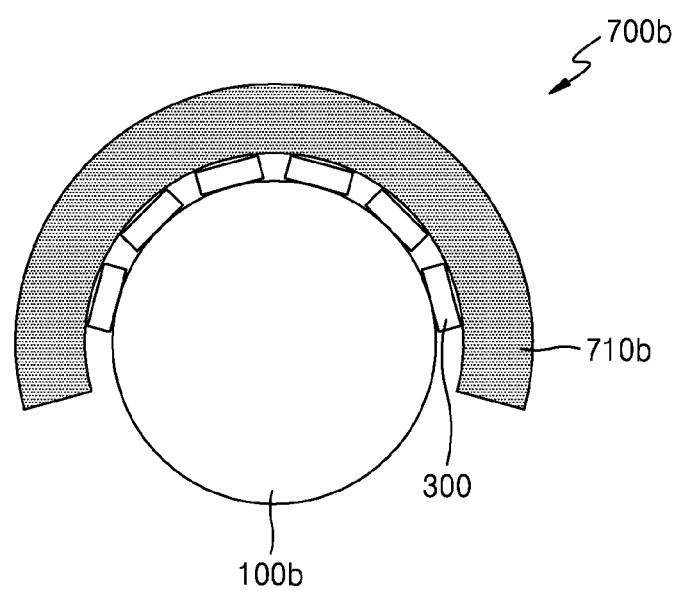
FIGS. 13A and 13B are cross-sectional views illustrating exemplary embodiments in which LEDs have been transferred by the transfer apparatus of FIG. 12.
Figure 13B:
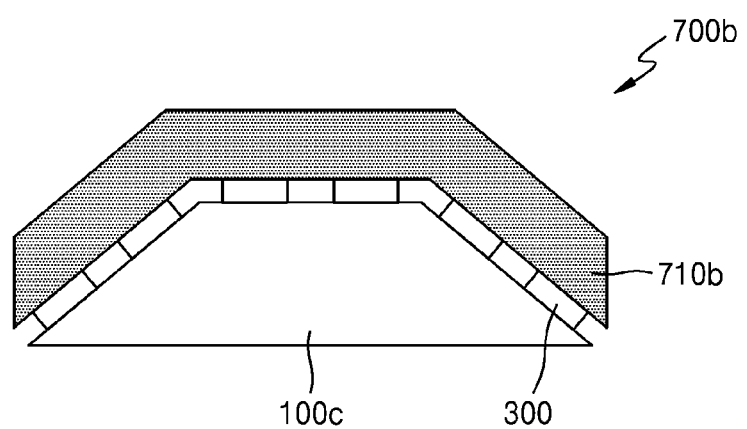

FIGS. 13A and 13B are cross-sectional views illustrating exemplary embodiments in which the LEDs 300 have been transferred by the transfer apparatus 700b of FIG. 12. The body portion 710b of the transfer apparatus 700b with the LEDs 300 thereon from removal from a carrier substrate may be folded or bent to surround a display substrate. Particularly, positions along the one surface to which the LEDs 300 may be temporarily attached (refer to FIG. 12) are moved to correspond to positions of the display substrate at which the LEDs will be disposed in a display apparatus.

Therefore, the plurality of LEDs 300 are transferred to a display apparatus at a same time, and especially to the display substrate 100b and 100c whose surface discontinuously changes.

Figure 14:
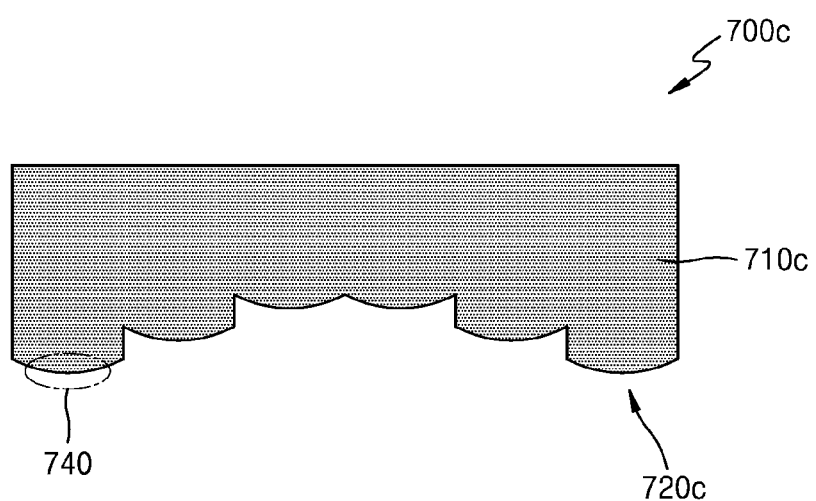
FIG. 14 is a cross-sectional view of yet another exemplary embodiment of a transfer apparatus according to the invention.

FIG. 14 is a cross-section view of yet another exemplary embodiment of a transfer apparatus 700c according to the invention. The transfer apparatus 700c may include a body portion 710c and an adhesive portion 720c which is on or defined by the body portion 710, allowing a plurality of LEDs 300 to be attached/detached thereto/therefrom.

As shown in FIG. 14, the adhesive portion 720c of the transfer apparatus 700c may include or define a convex surface 740 and the convex surface 740 may be provided in plural. When the adhesive portion 720c defined with the convex surface 740 contacts the LEDs 300, a distal end of the convex surface 740 may first contact each of the LEDs 300 disposed on a carrier substrate. When the distal ends of the convex surfaces 740 respectively contact the LEDs 300, the body portion 710c may be deformed as described with respect to FIG. 10B to bring remaining surfaces of the convex portions 740 extending from the distal ends thereof into contact with the LEDs 300. Accordingly, when contact of the adhesive portion 720c progresses from the distal end of the convex surface 740 to opposing ends thereof, the adhesive portion 720c may closely contact the LED 300 without air bubbles generated between the body portion 710c and the LEDs 300. The number of the convex surfaces 740 may correspond to the number of the LEDs 300.

While one or more exemplary embodiments have been described with reference to the figures, it will be understood by those of ordinary skill in the art that various changes in form and details may be made therein without departing from the spirit and scope as defined by the following claims. Accordingly, the true technical scope of the invention is defined by the technical spirit of the appended claims.

What is claimed is:

1. A transfer apparatus comprising:
   a body portion; and
   an adhesive portion connected to the body portion, with which a point light source of a display apparatus is attachable to and detachable from the transfer apparatus by contact therewith,
   wherein the adhesive portion is defined by a plurality of surfaces in different planes from each other.

2. The transfer apparatus of claim 1, wherein the body portion comprises an elastomer.

3. The transfer apparatus of claim 1, wherein the adhesive portion defines a first surface of the body portion.

4. The transfer apparatus of claim 3, wherein the body portion defines a second surface thereof which faces the first surface.

5. The transfer apparatus of claim 1, wherein a thickness of the body portion is non-uniform to define the plurality of the surfaces of the adhesive portion in different planes from each other.

6. The transfer apparatus of claim 1, wherein the plurality of surfaces of the adhesive portion in different planes from each other is defined by a plurality of sub-adhesive portions at different heights with respect to a common surface of the body portion.

7. The transfer apparatus of claim 6, wherein
   the point light source is provided in plurality, each of which is attachable to and detachable from the transfer apparatus by contact with the adhesive portion, and
   among the plurality of point light sources, at least one point light source is attachable to and detachable from the transfer apparatus with each of the plurality of sub-adhesive portions at the different heights with respect to the common surface of the body portion.

8. The transfer apparatus of claim 6, wherein the different heights of the plurality of sub-adhesive portions discontinuously change with respect to the common surface of the body portion.

9. The transfer apparatus of claim 6, wherein the different heights of the plurality of sub-adhesive portions are adjustable with respect to the common surface of the body portion.

10. The transfer apparatus of claim 6, wherein
    the different heights of the plurality of sub-adhesive portions defines an original state of the transfer apparatus, and
    in a deformed state of the transfer apparatus by an external pressure applied to the original state of the transfer apparatus, the plurality of sub-adhesive portions are disposed at a same height as each other with respect to the common surface of the body portion.

11. The transfer apparatus of claim 6, further comprising a plurality of sub-connectors respectively connecting the plurality of sub-adhesive portions to the body portion.

12. The transfer apparatus of claim 11, wherein a length of each of the plurality of sub-connectors is adjustable.

13. The transfer apparatus of claim 1, wherein a portion of the adhesive portion that contacts the point light source has a convex shape before contact with the point light source.

* * * * *